US008555951B2

(12) United States Patent
Delia et al.

(10) Patent No.: US 8,555,951 B2
(45) Date of Patent: *Oct. 15, 2013

(54) IMPLEMENTING A FRONT DOOR AIR TO WATER HEAT EXCHANGER

(75) Inventors: David J. Delia, Lagrangeville, NY (US); Wayne M. Delia, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 13/436,435

(22) Filed: Mar. 30, 2012

(65) Prior Publication Data

US 2012/0186790 A1 Jul. 26, 2012

Related U.S. Application Data

(63) Continuation of application No. 12/020,550, filed on Jan. 27, 2008, now Pat. No. 8,453,713.

(51) Int. Cl.
*B60H 1/00* (2006.01)
*F28D 15/00* (2006.01)

(52) U.S. Cl.
USPC ..................... 165/11.1; 165/104.33

(58) Field of Classification Search
USPC .......... 165/11.1, 104.33, 80.4, 80.5; 361/398, 361/701, 699, 724; 174/15.1
See application file for complete search history.

(56) References Cited

U.S. PATENT DOCUMENTS

| 2,867,064 | A | | 1/1959 | Hermansson |
| 4,934,233 | A | | 6/1990 | Brundage et al. |
| 5,573,562 | A | * | 11/1996 | Schauwecker et al. ...... 55/385.4 |
| 6,658,700 | B2 | * | 12/2003 | Wortman et al. ............... 16/382 |
| 6,775,137 | B2 | | 8/2004 | Chu et al. |
| 6,924,981 | B2 | | 8/2005 | Chu et al. |
| 7,245,485 | B1 | | 7/2007 | Morrell |
| 2003/0147216 | A1 | * | 8/2003 | Patel et al. ..................... 361/700 |
| 2004/0100770 | A1 | * | 5/2004 | Chu et al. ...................... 361/698 |
| 2004/0250992 | A1 | * | 12/2004 | Aoki et al. .................... 165/80.3 |
| 2006/0157592 | A1 | * | 7/2006 | Mahnken et al. ............. 239/461 |
| 2006/0232945 | A1 | * | 10/2006 | Chu et al. ...................... 361/724 |
| 2007/0084227 | A1 | * | 4/2007 | Haapamaki .................. 62/259.2 |
| 2007/0167125 | A1 | * | 7/2007 | Rasmussen et al. .......... 454/184 |
| 2007/0213000 | A1 | * | 9/2007 | Day .............................. 454/184 |

* cited by examiner

*Primary Examiner* — Ljiljana Ciric
*Assistant Examiner* — Jason Thomspon
(74) *Attorney, Agent, or Firm* — Cantor Colburn LLP

(57) ABSTRACT

A system for cooling electronic equipment is provided. The system includes enclosures with front and rear doors for holding assemblages of electronics, front and rear heat exchangers housed within each of the front and rear doors, respectively, a series of separate supply lines configured with control valves and flow control sensors that provide liquid coolant to each of the heat exchangers, a series of separate return lines configured with temperature sensors for exiting coolant from each of the heat exchangers, separate air purging valves for each of the supply and return lines and a series of spray shields. The spray shields prevent coolant leaks from entering an inlet airflow and protect the electronics from coolant leaks. The control valves are actuated by a controller in response to readings from the temperature and flow control sensors to separately control coolant flow to each of the front and rear heat exchangers.

5 Claims, 5 Drawing Sheets

IMPLEMENTING A FRONT DOOR AIR TO WATER HEAT EXCHANGER

CROSS-REFERENCE TO RELATED APPLICATION

The present application is a continuation of U.S. application Ser. No. 12/020,550, which was filed on Jan. 27, 2008. The entire contents of U.S. application Ser. No. 12/020,550 are incorporated herein by reference.

BACKGROUND OF THE INVENTION

1. Field of the Invention

This invention relates generally to systems and methods for cooling rack-mounted assemblages of individual electronic units, and more particularly to air to water heat exchangers in rack-mounted computer server units.

2. Description of the Related Art

Computing and telecommunications devices, such as routers, switches, network servers, and other similar types of devices, are often mounted in racks that are housed in medium or large size enclosures or cabinets. The use of enclosures and cabinets to house the computing and telecommunication devices concentrates the electronic equipment to better utilize space. However, the power dissipation and the resultant generation of heat by integrated circuit chips, and the modules containing the chips, continues to increase with increases in processor performance. The concentrations of modules in racks housed in enclosures and cabinets leads to heat building up around the modules. Integrated circuit chips, microprocessors, and other similar electronic components are designed to operate within a particular temperature window. Accordingly, the heat generated by such components must be removed from the enclosure they are housed in or else the components will overheat and fail.

Many cooling arrangements for electronic cabinets and enclosures are well known including the use of forced air from fans to remove heat, air to air heat exchangers, and air to water heat exchangers. In an effort to reduce server heat emissions, International Business Machines Corporation has introduced a rear door air to water heat exchanger that utilizes existing chilled water supplies from air conditioning systems that are normally already located in datacenters. Air to water heat exchangers ease the burden on existing air conditioning units within a datacenter, which are often already running at full capacity. The use of an air to water heat exchanger eases the burden on air conditioning systems by transferring some of the accumulated heat with an enclosure to the re-circulating water instead of to the ambient air.

FIGS. 1, 3, and 6 illustrate an existing rear door air to water heat exchanger and related fluid or water supply system. FIG. 1 illustrates a rear door 100 with fins 102 behind a protective barrier 104. The fins 102 conduct or transfer ambient heat to coils (hidden from view) that carry cooling fluid or water. The cooling fluid or water is supplied via a female coupling 106 and supply manifold 108. Cooling fluid or water that has been heated by the transferred ambient heat exits the rear door 100 via the return manifold 110 and male coupling 112. Female coupling 106 and male coupling 112 are joined with quick connects to flexible supply 122 and return hoses 124, respectively, of FIG. 3. The flexible supply 122 and return hoses 124 are held in place by hose retention plate 114. Drain port 116 provides a path for accumulated condensation. Air-purging valve 118 for the supply manifold 108, and air-purging valve 120 for the return manifold 110 remove air from the coils (hidden from view) that may affect the ability of the coils to remove heat from the rear door 100.

FIG. 6 is a schematic diagram of an existing air to water heat exchanger system 600. The example system 600 is shown with three rear doors 602, 604, and 606 of enclosures 608, 610, and 612, respectively. Chilled water from a building's air conditioning system is passed through a water to water heat exchanger 630 to cool down (draw away heat from) water or fluids that are supplied to the rear doors (602, 604, 606) via pump 614 and overflow tank 628 and input distribution manifold 616. Heated water from the rear doors (602, 604, 606) is returned via return distribution manifold 618. The distribution manifolds (616, 618) are equipped with quick disconnects 620 for connecting flexible supply and return hoses (shown in greater detail in FIGS. 1, 3, and 5). Flow control valve 622 receives specifications (signified by the letter S) from a central controller 626. A temperature sensor 624 provides feedback (signified by dotted line) to the flow control valve 622 about the temperature of the water or fluids being returned from the rear doors (602, 604, 606). The temperature feedback is compared to the specification range, and the flow control valve is adjusted accordingly. For example, if the temperature in the return line is increasing, the flow rate of the chilled water is increased in order to decrease the temperature of the water or fluids being sent to the rear doors (602, 604, 606).

SUMMARY OF THE INVENTION

Embodiments of the present invention include a system, method, and article for air to liquid cooling of electronic equipment enclosures, the system includes: one or more enclosures configured with front and rear doors for holding assemblages of electronics; front and rear air to liquid heat exchangers housed within each of the front and rear doors, respectively; a series of separate supply lines configured with control valves and flow control sensors that provide liquid coolant to each of the front and rear air to liquid heat exchangers; a series of separate return lines configured with temperature sensors for exiting coolant from each of the front and rear air to liquid heat exchangers; separate air purging valves for each of the supply and return lines; a series of spray shields mechanically connected to the front and rear doors for preventing coolant leaks from entering an inlet airflow, and to protect the assemblages of electronics from coolant leaks originating from junctions for connecting the supply and return lines to the front and rear door heat exchangers, and from leaks originating from the purging valves; and wherein the control valves are actuated by a central controller in response to readings from the temperature and flow control sensors to separately control coolant flow to each of the front and rear air to liquid heat exchangers.

A method for air to liquid cooling of electronic equipment enclosures with front and rear heat exchangers, the method includes: receiving a first set of temperature data from temperature sensors positioned on return lines of front door air to water heat exchangers; receiving a second set of temperature data from temperature sensors positioned on return lines of rear door air to water heat exchangers; comparing the first and second set of received temperature data with pre-existing standards and requirements; adjusting one or more flow control valves positioned on supply lines to the front and rear door heat exchangers in response to at least one of the received first and second set of temperature data being out of specification; wherein the flow rate of liquids in the supply lines to the front and rear door heat exchangers are independently controlled; and wherein the adjusting of flow rates of liquids enables the optimization of cooling of electronic units within an enclosure or cabinet.

An article comprising one or more computer-readable storage media containing instructions that when executed by a computer enables task execution improvement; wherein the method further includes: receiving a first set of temperature data from temperature sensors positioned on return lines of front door air to water heat exchangers; receiving a second set of temperature data from temperature sensors positioned on return lines of rear door air to water heat exchangers; comparing the first and second set of received temperature data with pre-existing standards and requirements; adjusting one or more flow control valves positioned on supply lines to the front and rear door heat exchangers in response to at least one of the received first and second set of temperature data being out of specification; wherein the flow rate of liquids in the supply lines to the front and rear door heat exchangers are independently controlled; and wherein the adjusting of flow rates of liquids enables the optimization of cooling of electronic units within an enclosure or cabinet.

TECHNICAL EFFECTS

As a result of the summarized invention, a solution is technically achieved for a system, method, and article for implementing differential front and rear door air to water cooling with improved safeguards to decrease the amount of heat released to the ambient air surrounding an enclosure or cabinet containing computing, networking, or communication equipment.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Embodiments of the invention provide a system, method, and article for implementing differential front and rear door air to water (liquid) cooling with improved safeguards to decrease the amount of heat released to the ambient air surrounding an enclosure or cabinet containing computing, networking, or communication equipment. The addition of a front door heat exchanger addresses the concerns of datacenter operators that are already near capacity with their air conditioning for the ambient air within the datacenter room. The front door heat exchanger pre-cools inlet air as the air enters the enclosure. The reduction in inlet air temperature to the electronic components within the enclosure increases the reliability of the system. The heat load removed by the front door heat exchanger is added to the heat load removed by the rear door heat exchanger, and acts to further reduce air conditioning energy costs and enclosure heat emissions. In addition, the added ability to remove extra heat generated by the electronic components enables datacenter operators to fully populate enclosures and cabinets, thereby freeing valuable floor space.

The implementation of front door air to water heat exchangers in embodiments of the invention is facilitated by the introduction of splash guards/shields around and near supply and return quick disconnects, as well as air purging valves. The splash guards/shields are critical for the safe operation of a front door air to water heat exchanger, since airflow is generally from front to back in equipment enclosures and cabinets, and a leak from the quick disconnects or purging valves may be directed at sensitive components within the enclosure.

Embodiments of the invention employ additional control valves and sensors actuated by software to enhance the control of water or liquid flows between front and rear door air to water heat exchangers. The software enables the front door heat exchanger to receive a different flow rate than the rear door heat exchanger, in response to customer minimum/maximum setting requirements, or in response to temperature and flow rate variations reported by the flow rate and temperature sensors.

Figure 1:
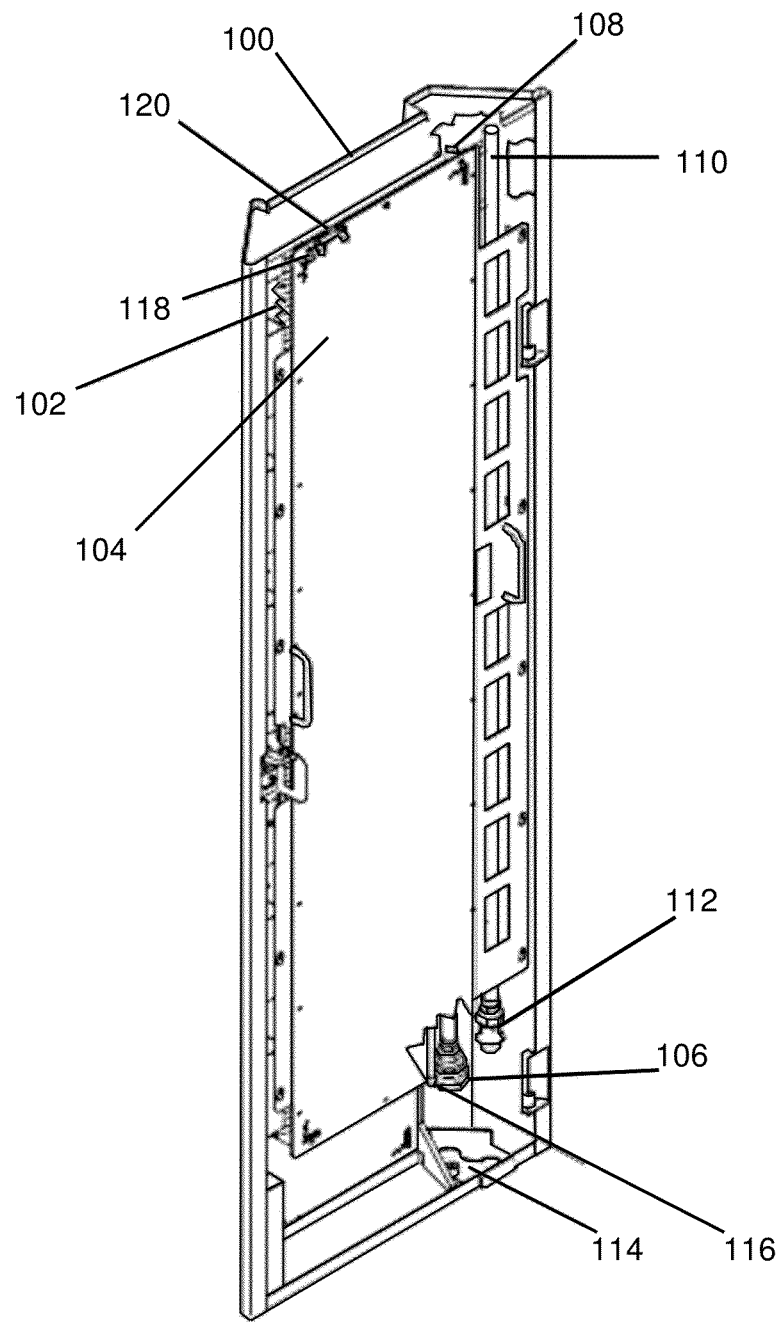
FIG. 1 illustrates a perspective view of an existing implementation of a rear door air to water heat exchanger.
Figure 2:
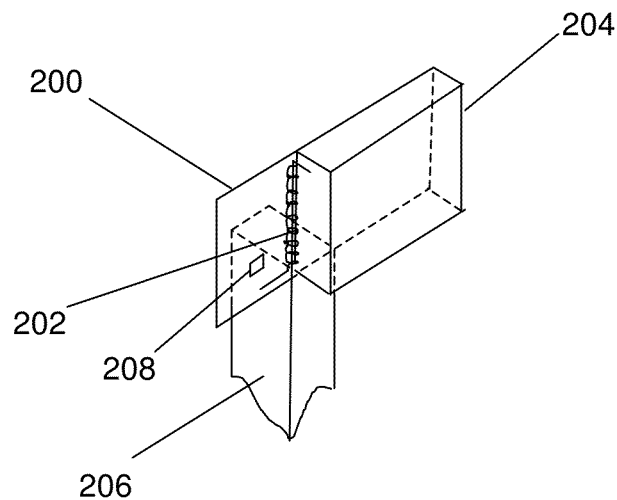
FIG. 2 illustrates a partial perspective view of an upper spray shield according to embodiments of the invention.

FIG. 2 illustrates a partial perspective view of an upper spray shield 200 according to embodiments of the invention. As shown in FIG. 1, a rear door heat exchanger has two air purging valves (118, 120) that are similar to stem valves that are found on car tires. The air purging valves (118, 120) remove air from the copper coils within the heat exchanger. However, the air purging valves become a significant liability when they fail in an implementation in a front door air to water heat exchanger of a similar construction to the rear door heat exchanger. During a potential failure of an air purging valve, cooling water or fluids are introduced into the inlet airflow that are then sprayed on the electronics within the cabinet or enclosure. The upper spray shield 200 is affixed to the existing protective barrier or to the front door housing (both shown as 204) and prevents water or liquids from entering the inlet airflow during an air purging valve failure. The upper spray shield 200 is transparent to allow the detection of leaks, and is spring loaded with spring 202 to ensure the upper spray shield 200 is in place after the purging valves have been used. The upper spray shield 200 guides the leaks into a drain channel 206 down the side of the front door cover and away from the electronics in the enclosure. The drain channel 206 may be either internal or external to the front door cover. A moisture sensor 208 may also be affixed in the area of the upper spray shield 200 to warn of any leaks during operation. In response to a detected leak, water or liquid flow to the area may be curtailed, and operation of the electronics within the enclosure may be scaled back to reflect the loss of cooling capacity.

Figure 3:
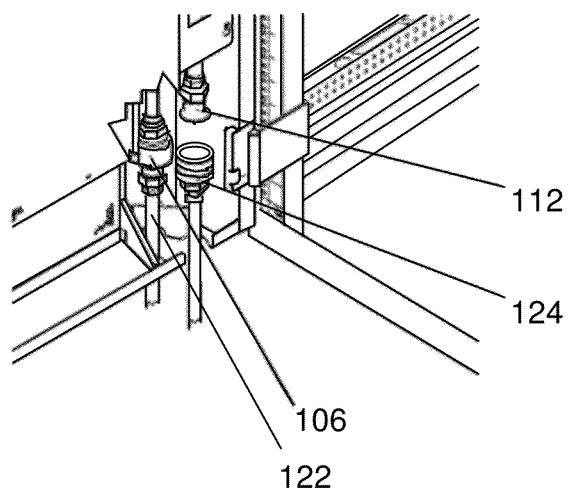
FIG. 3 illustrates a partial perspective view of the supply and return hoses and their connection to the rear door of FIG. 1.
Figure 4:
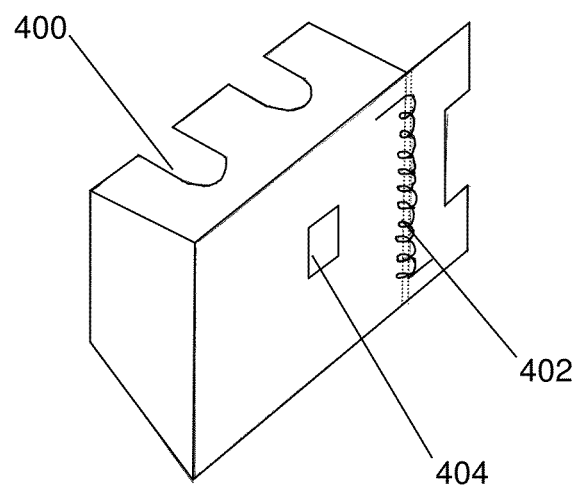
FIG. 4 illustrates a perspective view of a lower spray shield according to embodiments of the invention.

FIG. 4 illustrates a perspective view of a lower spray shield 400 according to embodiments of the invention. The lower spray shield 400 fits over the quick connects that join the female coupling 106 and male coupling 112 to the flexible supply 122 and return hoses 124, respectively, of FIG. 3 (which are similar to connections on a front door air to water heat exchanger), and prevents water or fluids from reaching the electronics. Industry standard quick connects have been known to stick in the open position, as well as partially connect, causing leaks. The lower spray shield 400 is made of transparent material to allow visual detection of any leaks or spraying of coolant. In addition, the lower spray shield 400 is spring loaded with spring 402 to ensure that the lower spray shield 400 is in the protective position after connections are made or adjusted. The lower spray shield 400 directs leaks to the bottom of the enclosure or cabinet door, where the coolant is collected. A moisture sensor 404 may also be affixed in the area of the lower spray shield 400 to warn with an audible alarm or visual signals of any leaks during operation. In response to a detected leak, water or liquid flow to the area may be curtailed, and operation of the electronics within the enclosure may be scaled back to reflect the loss of cooling capacity.

Figure 5:
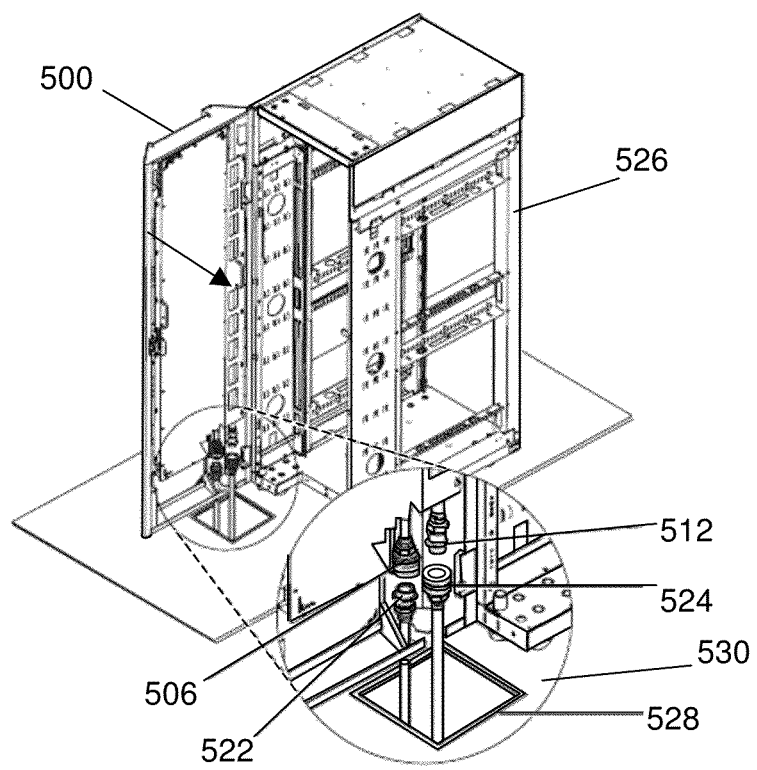
FIG. 5 illustrates a perspective view of a computer equipment enclosure with a front door air to water heat exchanger in an open position according to embodiments of the invention.
Figure 6:
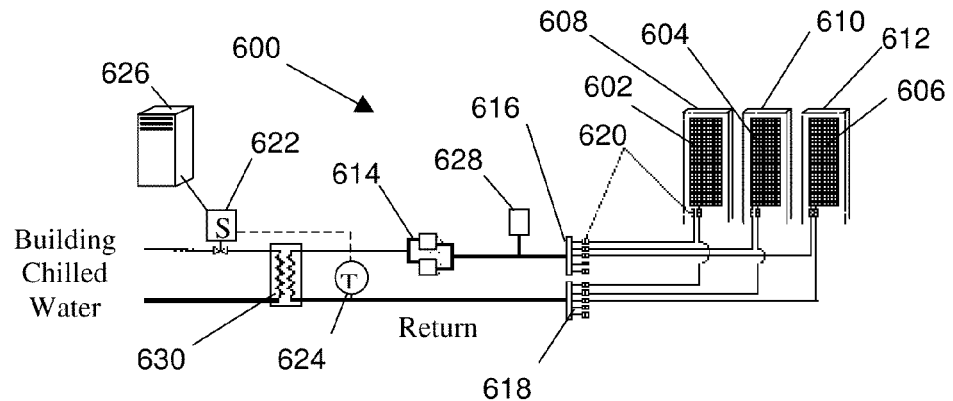
FIG. 6 is a schematic diagram of an existing air to water heat exchanger system.

FIG. 5 illustrates a perspective view of a computer equipment enclosure 526 with a front door air to water heat exchanger 500 in an open position with the protective shields of FIGS. 2 and 4 removed according to embodiments of the invention. The flexible supply 522 and return hoses 524 are provided to the female coupling 506 and male coupling 512 in the front door 500 via an opening 528 in a floor 530.

Figure 7:
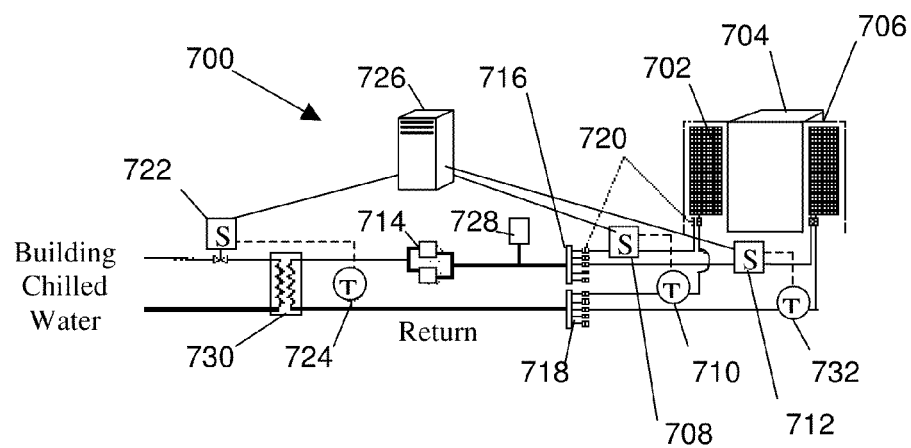
FIG. 7 is a schematic diagram of a differential air to water heat exchanger system that feeds and controls water or fluid flows to both rear and front door heat exchangers according to embodiments of the invention.

FIG. 7 is a schematic diagram of a differential air to water heat exchanger system 700 that feeds and controls water or fluid flows to both front 702 and rear door heat exchangers 706 of an enclosure 704 according to embodiments of the invention. The example system 700 is shown with the front 702 and rear doors 706 of the enclosure 704 in an open position. Chilled water from a building's air conditioning system is passed through a water to water heat exchanger 730 to cool down (draw away heat from) water or fluids that are supplied to the front 702 and rear doors 706 via pump 714, overflow tank 728, and input distribution manifold 716. Heated water from the front 702 and rear doors 706 is returned via return distribution manifold 718. The distribution manifolds (716, 718) are equipped with quick disconnects 720 for connecting flexible supply and return hoses (shown in greater detail in FIGS. 1, 3, and 5). Flow control valve 722 receives specifications (signified by the letter S) from a central controller 726. A temperature sensor 724 provides feedback (signified by dotted line) to the flow control valve 722 about the temperature of the water or fluids being returned from the front 702 and rear doors 706. The temperature feedback is compared to the specification range, and the flow control valve is adjusted accordingly. For example, if the temperature in the return line is increasing, the flow rate of the chilled water is increased in order to decrease the temperature of the water or fluids being sent to the front 702 and rear doors 706.

Continuing with FIG. 7, embodiments of the invention employ additional control valves (708, 712) and sensors (710, 732) actuated by software to enhance the control of water or liquid flows between front 702 and rear door 706 air to water heat exchangers. The additional controls (708, 712) and sensors (710, 732) are positioned between the distribution manifolds (716, 718) and the front 702 and rear doors 706. The software in central controller 726 enables the front door heat exchanger to receive a different flow rate than the rear door heat exchanger, in response to customer minimum/maximum setting requirements, or in response to temperature and flow rate variations reported by the control valve (flow rate) (708, 712) and temperature sensors (710, 732).

Figure 8:
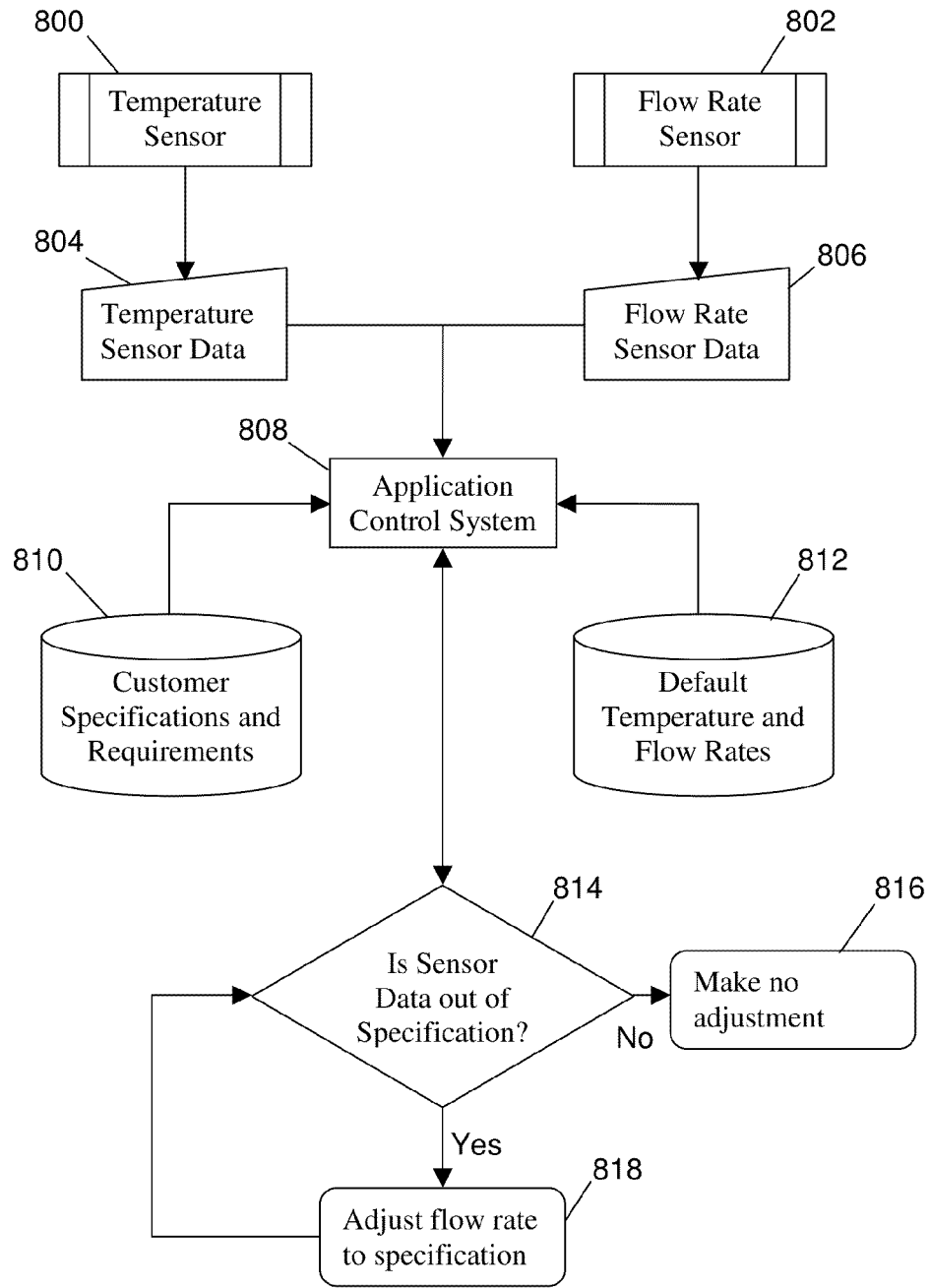
FIG. 8 is a flowchart for implementing adjustments between the rear and front door heat exchangers according to embodiments of the invention.

FIG. 8 is a flowchart for implementing adjustments between the rear and front door heat exchangers according to embodiments of the invention. A series of temperature sensors 800 are positioned on each of the return lines from both the front and rear door heat exchangers and provide temperature sensor data 804. Flow rate sensors 802 are placed with the control valves on the supply lines to the front and rear door heat exchangers, and provide flow rate data 806. The data readings (804, 806) supplied by the hardware temperature 800 and flow rate sensors 806 are processed as inputs to an application control system 808. The application control system compares the sensor readings (data) (804, 806) with existing standards and requirements specified by the customer 810, or included as system default values 812. The application control system 808 subsequently produces output signals, to adjust the flow rate of water (liquid) (block 818) to the front door heat exchanger, if an adjustment is required (decision block 814 is Yes). If the sensor supplied data is within specification (decision block 814 is No), no adjustments (block 816) are made to the flow rate of liquid to the front door heat exchangers. The added capability of varying the flow rate of the chilled water supply to the front door heat exchanger enables the optimization of cooling of electronic units within an enclosure or cabinet.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiments to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for air to liquid cooling of electronic equipment enclosures, the system comprising:
   an enclosure configured for holding electronics and including front and rear doors;
   air to liquid heat exchangers housed within each of the front and rear doors;
   separate supply lines configured with control valves and flow control sensors that provide liquid coolant to each of air to liquid heat exchangers;
   a plurality of temperature sensors;

separate return lines configured with one of the plurality of the temperature sensors for exiting coolant from each of the air to liquid heat exchangers;

separate air purging valves for each of the supply and return lines;

spray shields affixed to the front door and spray shields fit over connections between the supply and return lines, the spray shields being disposed and configured to prevent liquid coolant from entering an inlet airflow and to protect the electronics from liquid coolant in an event the liquid coolant leaks from the supply and return or air the purging valves, the spray shield being at least one or both of transparent and spring-loaded; and wherein the control valves are actuated by a central controller in response to readings from the plurality of the temperature sensors and the flow control sensors to separately control liquid coolant flow to each of the air to liquid heat exchangers.

2. The system of claim 1, wherein the spray shields direct leaked liquid coolant to a channel.

3. The system of claim 1, further comprising moisture sensors
configured to detect a leak of the liquid coolant and to responsively sound an alarm and initiate visual signals.

4. The system of claim 3, wherein the control valves are configured to curtail a flow of the liquid coolant to each of the air to liquid heat exchangers in response to a signal from the moisture sensors.

5. A system, comprising:

air to liquid heat exchangers housed within front and rear doors of an enclosure;

separate supply lines configured with control valves and flow control sensors that provide liquid coolant to each of the air to liquid heat exchangers;

separate return lines configured with a temperature sensor for exiting coolant from each of the air to liquid heat exchangers;

separate air purging valves for each of the supply and return lines; and spray shields affixed to the front door and spray shields fit over connections between the supply and return lines, the spray shields being configured to prevent liquid coolant leaks from entering an inlet airflow and to shield liquid coolant leaks originating from junctions connecting the supply and return lines to the front and rear door heat exchangers and from the purging valves, the spray shields being at least one or both of transparent and spring-loaded, and the control valves being actuatable in response to readings from the temperature sensors and the flow control sensors to separately control coolant flow to each of the air to liquid heat exchangers.

* * * * *